US006813296B2

(12) United States Patent
Goyal et al.

(10) Patent No.: US 6,813,296 B2
(45) Date of Patent: Nov. 2, 2004

(54) GASB-CLAD MID-INFRARED SEMICONDUCTOR LASER

(75) Inventors: Anish Goyal, Cambridge, MA (US); George Turner, Westford, MA (US)

(73) Assignee: Massachusetts Institute of Technology, Cambridge, MA (US)

( * ) Notice: Subject to any disclaimer, the term of this patent is extended or adjusted under 35 U.S.C. 154(b) by 0 days.

(21) Appl. No.: 10/132,580

(22) Filed: Apr. 25, 2002

(65) Prior Publication Data

US 2003/0202550 A1 Oct. 30, 2003

(51) Int. Cl.$^7$ .............................................. H01S 5/00
(52) U.S. Cl. .............................. 372/45; 372/43; 372/44; 372/46; 372/47; 372/48; 372/49; 372/50
(58) Field of Search ..................... 372/43–50

(56) References Cited

U.S. PATENT DOCUMENTS

| | | | | |
|---|---|---|---|---|
| 4,184,171 A | * | 1/1980 | Panish ........................ | 372/45 |
| 4,207,122 A | | 6/1980 | Goodman | |
| 5,251,225 A | * | 10/1993 | Eglash et al. ................ | 372/45 |
| 5,315,608 A | | 5/1994 | Choi et al. | |
| 5,594,750 A | * | 1/1997 | Zhang et al. ................ | 372/45 |
| 5,625,635 A | * | 4/1997 | Kurtz et al. ................. | 372/45 |
| 5,764,842 A | * | 6/1998 | Aoki et al. ................. | 385/131 |
| 5,793,787 A | * | 8/1998 | Meyer et al. ................ | 372/45 |
| 5,802,090 A | | 9/1998 | York et al. | |
| 5,889,805 A | | 3/1999 | Botez et al. | |
| 6,072,189 A | * | 6/2000 | Duggan ...................... | 257/14 |
| 6,219,365 B1 | | 4/2001 | Mawst et al. | |
| 6,275,296 B1 | * | 8/2001 | Numai ....................... | 356/459 |
| 2001/0043636 A1 | * | 11/2001 | Bewley et al. ............... | 372/70 |

FOREIGN PATENT DOCUMENTS

| | | |
|---|---|---|
| EP | 0003079 | 7/1979 |
| WO | 9842034 | 9/1998 |

OTHER PUBLICATIONS

: Goyal, A.K., Turner, G.W., Manfra, M.J., Foti, P.J., O'Brien and P., Sanchez, A.; "High–Performance, Aluminum–Free, Optically–Pumped Mid–1R Semiconductor Lasers"; LEOS Annual Meeting Nov. 13, 2001; pp. LEOS011113–1 through LEOS011113–14.

: Goyal, A.K., Turner, G.W., Manfra, M.J., Foti, P.J., O'Brien and P., Sanchez, A., "High–Performance, Aluminum–Free, Optically–Pumped Mid–1R Semiconductor Lasers"; Proceedings LEOS Annual Meeting Nov. 13, 2001; pp. LEOS011113–1 through LEOS011113–14.

: Fedorenko, A.I., Fedorov, A.G., Sipatov, A. Yu and Mironov, O.A.; "The Epitaxial Growth of IV–VI Hetrostructures and Superlattices on (001) Si"; XP 000622891; 1995 Elsevier Science S.A., Thin Solid Films 267 (1995); pp. 134–137.

(List continued on next page.)

*Primary Examiner*—Don Wong
*Assistant Examiner*—Delma R. Flores-Ruiz
(74) *Attorney, Agent, or Firm*—Daly, Crowley & Mofford, LLP

(57) ABSTRACT

A semiconductor laser operating in the mid-infrared region is described. In one particular embodiment, the semiconductor laser is provided having first and second cladding layers consisting essentially of GaSb that surround an active core, wherein the index of refraction of the first and second cladding layers is less than but close to the index of refraction of active core. The semiconductor laser in accordance with this invention has a low divergence angle with a high power efficiency. In an alternate embodiment, the semiconductor laser is provided having first and second cladding layers consisting essentially of $Al_xGa_{1-x}As_ySb_{1-y}$ that surround the active core with an aluminum mole fraction between 0 and 25 percent. The index of refraction of the first and second cladding layers consisting essentially of $Al_xGa_{1-x}As_ySb_{1-y}$ can be adjusted to match a variety of types of active cores and to provide a pre-determined divergence.

35 Claims, 4 Drawing Sheets

OTHER PUBLICATIONS

: Pinczolits, M., Springholz, G., and Bauer, G.; "Direct Formation of Self–Assembled Quantum Dots Under Tensile Strain by Heteroepitaxy of PbSe on PbTe (111)"; XP–000771204; 1998 American Institute of Physics, Applied Physics Letters, vol. 71 No. 2, Jul. 13, 1998; pp. 250–252.

: Holy, V., Springholz, G., Pinczolits, M. and Bauer, G.; "Strain Induced Vertical and Lateral Correlations in Quantum Dot Supperlattices"; XP–002155321; 1999 The American Physical Society, vol. 83 No. 2, Jul. 12, 1998; pp. 356–359.

: Asahi, Hajime, "Self–Organized Quantum Wires and Dots in III–V Semiconductors"; XP–000721510; Advanced Materials, 1997; pp. 1019–1026.

: Harman, T.C., Taylor, P.J., Spears, D.L. and Walsh, M.P., "Thermoelectric Quantum–Dot Superlattices with High ZT"; Journal of Electronic Materials, vol. 29 No. 1, 2000; pp. L1–L4.

PCT Search Report dated Aug. 13, 2003 for PCT Application No. PCT/US02/40095 filed on Dec. 16, 2002, including PCT/ISA/220 and PCT/ISA/210 forms.

Kobayashi et al.; "Liquid–Phased Epitaxial Growth of InGaAsSb/GaSB and InGaAsSb/AlGaAsSB DH Wafers;" Jpn. J. Appl. Phys. vol. 18 (1979), No. 11; XP009015118; pp. 2169 and 2170.

Choi et al.; High–Power Multiple–Quantum–Well GaInAsSB/AlGaAsSB Diode Letters Emitting at 2.1 um With Low Threshold Current Density; 1992 American Institute of Physics; 320 Applied Physics Letters 61(1992) Sep., 7 No. 10 New York, US; XP00029376; pp. 1154–1156.

Liau et al.; "InAs1–xSbx/In1–y GayAs Multiple–Quantum–Well Heterostructure Design for Improved 4–5 um Lasers;" 1994 American Institute of Physics; 320 Applied Physics Letters 65 (1994) Jun., 13 No. 24, Woodbury, NY, US; XP000449662; pp. 3219–3221.

Choi et al.; "Double–Heterostructure Diode Lasers Emitting at 3 um With a Metastable GaInAsSb Active Layer and AlGaAsSb Cladding Layers;" 1994 American Institute of Physics; 320 Applied Physics Letters 65(1994) May, 9 No. 19, Woodbury, NY US; XP000449530; pp. 2474–2476.

* cited by examiner

GASB-CLAD MID-INFRARED SEMICONDUCTOR LASER

STATEMENT REGARDING FEDERALLY SPONSORED RESEARCH

This invention was made with government support under Contract No. F19628-00-C-0002 awarded by the United States Air Force. The government has certain rights in this invention.

CROSS REFERENCE TO RELATED APPLICATIONS

Not Applicable.

FIELD OF THE INVENTION

This invention relates generally to semiconductor lasers and more particularly to semiconductor lasers that emit radiation in the mid-infrared region.

BACKGROUND OF THE INVENTION

As is known in the art, semiconductor lasers typically include a plurality of layers of semiconductor materials. A conventional semiconductor laser includes a first semiconductor material corresponding to an active core in which light can be generated or can otherwise propagate. First and second cladding layers also provided from semiconductor materials are disposed about the active core. The first and second cladding layers are provided having a lower index of refraction than the active core, thus causing light to be generally contained within the active core.

The active core can be comprised of a plurality of active structures in combination with associated confinement layers. The confinement layers are provided surrounding each of the one or more active structures. The confinement layers are also referred to as absorber layers.

An "electrically pumped" laser is a semiconductor laser in which light can be generated in and emitted from the active core in response to an electric current provided to the semiconductor laser. When the first cladding layer is doped to provide an n-type characteristic and the second cladding layer is doped to provide a p-type characteristic, the two cladding layers taken together with the active core form a diode. When the diode is forward biased with an external power supply, an electric current is generated through the semiconductor laser, and electrons and holes recombine in the active core resulting in light that propagates in and is emitted from the active core.

Alternatively, an "optically pumped" laser is a semiconductor laser in which light can be propagated in and emitted from the active core in response to light from an external light source, properly directed and at the proper wavelength. With this particular arrangement the cladding layers can be provided without the need for dopants.

It is recognized that semiconductor lasers can be constructed to be either electrically pumped or optically pumped and to have either emission of light from the edge of the semiconductor laser or from the surface of the semiconductor laser. It will also be appreciated that conventional cladding layers that contain high fractions of Aluminum (Al) are generally difficult to dope to provide the first and second cladding layers with the n-type and the p-type characteristics respectively. Also, conventional cladding layers that contain high fractions of Aluminum (Al) tend to be susceptible to degradation due to oxidation.

A wide variety of conventional semiconductor lasers have been described. In general, the physical characteristics of the semiconductor lasers are determined in accordance with a variety of factors, including but not limited to the desired wavelength of the laser light, the desired output power, the desired divergence angle, the desire for the electrically pumped or the optically pumped semiconductor laser, and the desire for edge or surface emission.

In one embodiment, a semiconductor laser made to operate at the mid-infrared region, i.e. having light having a wavelength of between 1.5 and 12 micrometers, has an active core consisting of GaSb in combination with other elements, and first and second cladding layers that include Aluminum. Such semiconductor lasers typically have an active core with an index of refraction of approximately 3.8, and first and second cladding layers with an index of refraction of approximately 3.2.

As described above, it is understood that it is desirable to provide the first and second cladding layers having a lower index of refraction than the active core in order to confine light within the active core. It is also understood that, if the index of refraction of the first and second cladding layers is greatly different from that of the active core, the light that emerges from the active core will have a wide divergence angle. A semiconductor laser for which the active core has an index of refraction of approximately 3.8 and the first and second cladding layers have an index of refraction of approximately 3.2 conventionally provides a divergence angle of nearly ninety degrees in the plane perpendicular to the plane of the epilayers.

Since it is difficult to collect all of the light output power from a semiconductor laser having a relatively wide divergence angle, a narrow divergence angle is preferred in most applications.

It would, therefore, be desirable to provide a semiconductor laser that operates in the mid-infrared region and for which the divergence angle is relatively narrow. It would also be desirable to provide a semiconductor laser that operates in the mid-infrared region and that contains little or no Aluminum in the first and the second cladding layers. It would be still further desirable to provide a semiconductor laser that operates in the mid-infrared region and for which the index of refraction of the first and second cladding layers can be adjusted so that it can be matched with the index of refraction of a variety of types of active cores.

SUMMARY OF THE INVENTION

The present invention provides a semiconductor laser that operates in the mid-infrared region and that provides a relatively narrow divergence angle. While a particular active core is described, it will be understood that this invention applies equally to a variety of active cores.

In accordance with the present invention, a semiconductor laser includes an active core and cladding layers on each side of the active core, wherein at least one of the cladding layers consists essentially of GaSb. This structure provides a semiconductor laser that operates in the mid-infrared region of 1.5 to twelve microns. The active core can be comprised of In, Ga, Sb and As.

With this particular arrangement, the cladding layers provide an index of refraction less than but close to the index of refraction of the active core, thus providing laser light emission having a narrow divergence angle. Furthermore, cladding layers that contain no Aluminum (Al) are more easily doped to provide cladding layers having n-type and p-type characteristics and have smaller bandgap discontinuities. This facilitates the fabrication of an electrically pumped semiconductor laser.

In accordance with another aspect of the present invention, a semiconductor laser includes an active core and cladding layers on each side of the active core, wherein at least one of the cladding layers consists essentially of $Al_xGa_{1-x}As_ySb_{1-y}$, wherein the Al fraction, x, is selectable in the range of zero to twenty five percent. This structure provides a semiconductor laser that operates in the mid-infrared region of three to twelve microns.

With this particular arrangement, at least one selectable cladding layer provides an index of refraction less than but close to the index of refraction of a variety of types of active cores, thus providing laser light emission having a narrow divergence angle.

BRIEF DESCRIPTION OF THE DRAWINGS

The foregoing features of the invention, as well as the invention itself may be more fully understood from the following detailed description of the drawings, in which.

DETAILED DESCRIPTION OF THE INVENTION

Before describing the semiconductor laser in accordance with the present invention, some introductory concepts and terminology are explained. As used herein, the term "active structure," refers to one of a variety of semiconductor laser structures in which light is generated and/or through which light propagates. For example, the active structure can be a quantum well structure as described below in FIG. 1. The active structure is comprised of a variety of "active structure portions." The active structure portions are layers of semiconductor material that comprise the active structure.

The term "active core," as used herein, describes one or more of the active structures in combination with associated absorber layers. Thus, the term active core is used to describe the entire portion of the semiconductor laser in which light is generated and/or through which light propagates, and from which light is emitted. For example, the active core can be the active core 15 of FIG. 1.

Figure 1:
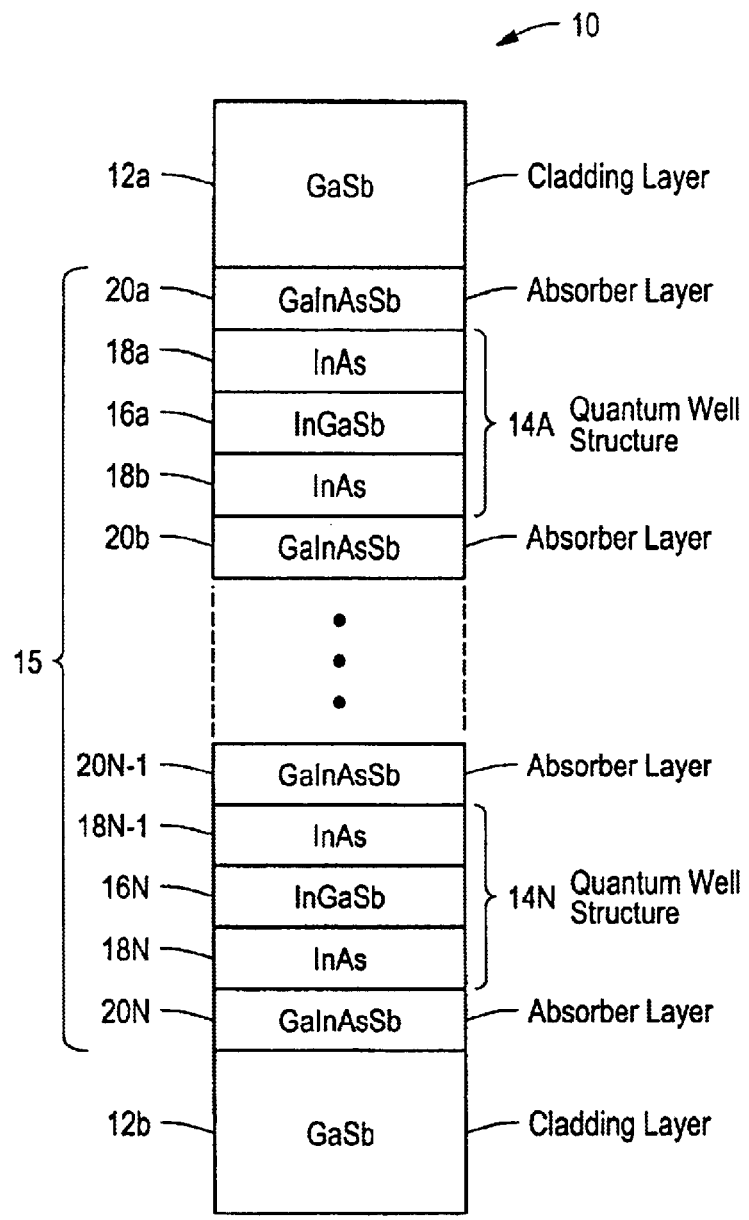
FIG. 1 is a pictorial diagram showing the structure of an exemplary semiconductor laser in accordance with the present invention.

Referring now to FIG. 1, an exemplary semiconductor laser 10 in accordance with the present invention includes one or more active structures 14a–14N adapted to operate in the mid-infrared region of three to twelve microns. In this particular embodiment, the one or more active structures 14a–14N are shown as quantum well structures, each quantum well structure comprising a central InGaSb active structure portion 16a–16N surrounded by respective first and second InAs active structure portions (18a, 18b)–(18N-1, 18N). Each active structure 14a–14N is surrounded by first and second GaInAsSb absorber layers (20a,20b)–(20N-1, 20N). One or more active structures 14a–14N with associated absorber layers (20a,20b)–(20N-1, 20N) can be provided in accordance with this invention. Taken in combination, the active structures 14a–14N and the associated absorber layers (20a,20b)–(20N-1, 20N) provide the active core 15.

While the active structures 14a–14N are shown as type II quantum well structures, it should be recognized that a variety of active structures can be used with this invention. For example, type I quantum well or bulk active structures can also be used with this invention.

First and second cladding layers 12a, 12b, consisting essentially of GaSb, are provided to contain the light that propagates in the active core 15. In one particular embodiment, the first and second cladding layers 12a, 12b are undoped and the active core 15 is optically pumped from an external light source (not shown). In an alternate embodiment, the first GaSb cladding layer 12a is doped to provide an n-type cladding layer 12a and the second GaSb cladding layer 12b is doped to provide a p-type cladding layer 12b. With this particular arrangement, the n-type and the p-type cladding layers 12a, 12b form a diode which, when forward biased, can cause light in the mid infrared region to be generated in and emitted from the active core 15.

In one illustrative embodiment, hereafter referred to as the tested laser structure, the active core 15 is provided having a thickness of 1 micrometer. The GaInAsSb absorber layers 20a–20N are provided having a combined thickness of approximately 1 micrometer. The absorber layers are associated with ten quantum well structures 14A–14N. The quantum well structures are provided having 21 angstrom thick InAs active structure portions 18a–18N, and 24 angstrom thick InGaSb active structure portions 16a–16N. The first and the second GaSb cladding layers 12a, 12b are provided each having a thickness of 4 micrometers. The second GaSb cladding layer 12b is grown directly onto a GaSb substrate. The tested laser structure is optically pumped. The tested laser structure corresponds to test data described below in FIGS. 3 and 4.

While a particular illustrative semiconductor laser is described above, it should be understood that the active core 15 can be provided having a thickness in the range of 0.1 to 10 micrometers, the GaInAsSb absorber layers 20a–20N can be provided each having a thickness in the range of 5 to 1000 nanometers, and the GaSb cladding layers 12a, 12b can be provided each having a thickness in the range of 1 to 10 micrometers. Also, one or more active structures 14a–14N, each associated with respective absorber layers 20a–20N, can be provided in accordance with this invention. Furthermore, while two GaSb cladding layers 12a, 12b are shown, in an alternate embodiment, only one of the cladding layers consists essentially of GaSb. In another alternate embodiment, the first and second cladding layers can be provided having n-type and p-type characteristics respectively so as to provide an electrically pumped semiconductor laser.

Figure 2:
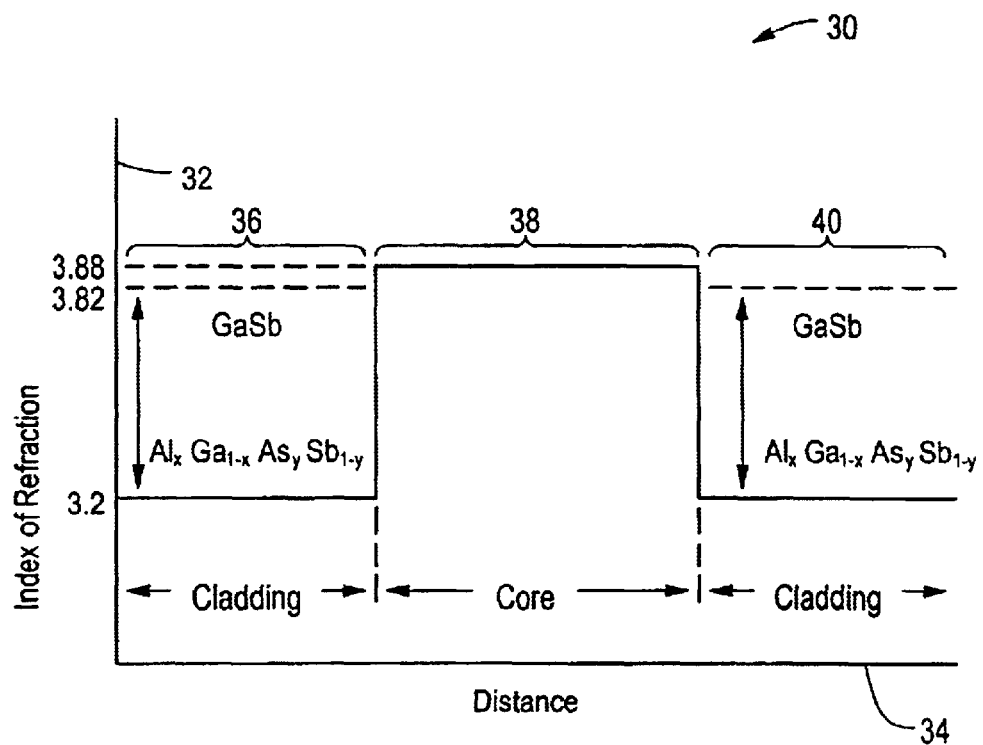
FIG. 2 is a graph showing the index of refraction versus depth in the semiconductor laser of FIG. 1.

Referring now to FIG. 2 in combination with FIG. 1, a graph 30, corresponding to the exemplary semiconductor laser 10, has a first axis 32 corresponding to index of refraction and a second axis 34 corresponding to depth into the semiconductor laser in a direction perpendicular to the plane of the first cladding layer. Thus, a first cladding layer region 36 corresponds to the first cladding layer 12a. An active core region 38 corresponds to the active core 15. A second cladding layer region 40 corresponds to the second cladding layer 12b.

As indicated by the active core region 38, the index of refraction of the active core 15 is 3.88. Also as indicated by the first and second cladding layer regions 36, 40, the index of refraction of the first and second cladding layers 12a, 12b is 3.82, wherein the first and second cladding layers consist of GaSb.

It will be recognized that for the particular exemplary semiconductor laser 10, having the first and second cladding layers 12a, 12b with an index of refraction of 3.82 and the active core 15 with an index of refraction of 3.88, the laser light will be contained within the active core 15. It will also be recognized that, because the index of refraction of the first and second cladding layers 12a, 12b, is very close to the index of refraction of the active core 15, the divergence angle of the emitted laser light will be small. Divergence angle results are described below in association with FIG. 4.

In an alternate embodiment, the cladding layers 12a, 12b, corresponding to the first and second cladding layer regions 36, 40, can consist essentially of $Al_xGa_{1-x}As_ySb_{1-y}$, where the x and y correspond to percentage proportions in decimal notation. Thus, depending upon the proportions x and y, the index of refraction of first and second cladding layers corresponding to the first and second cladding layer regions 36, 40 can be adjusted as indicated, in the range of 3.2 to 3.82. By adjusting the proportions x and y and thereby the index of refraction the first and second cladding layers, the index of refraction of the first and second cladding layers can be adjusted to match the index of refraction of a variety of active core types. Thus, the divergence angle can be minimized for the variety of active core types. The divergence angle can also be adjusted for particular applications. The percentage x that describes the percentage of Aluminum in the first and second cladding layers 12a, 12b can be provided in the range of from zero to twenty five percent. The preferred range, however, is less than ten percent.

Figure 3:
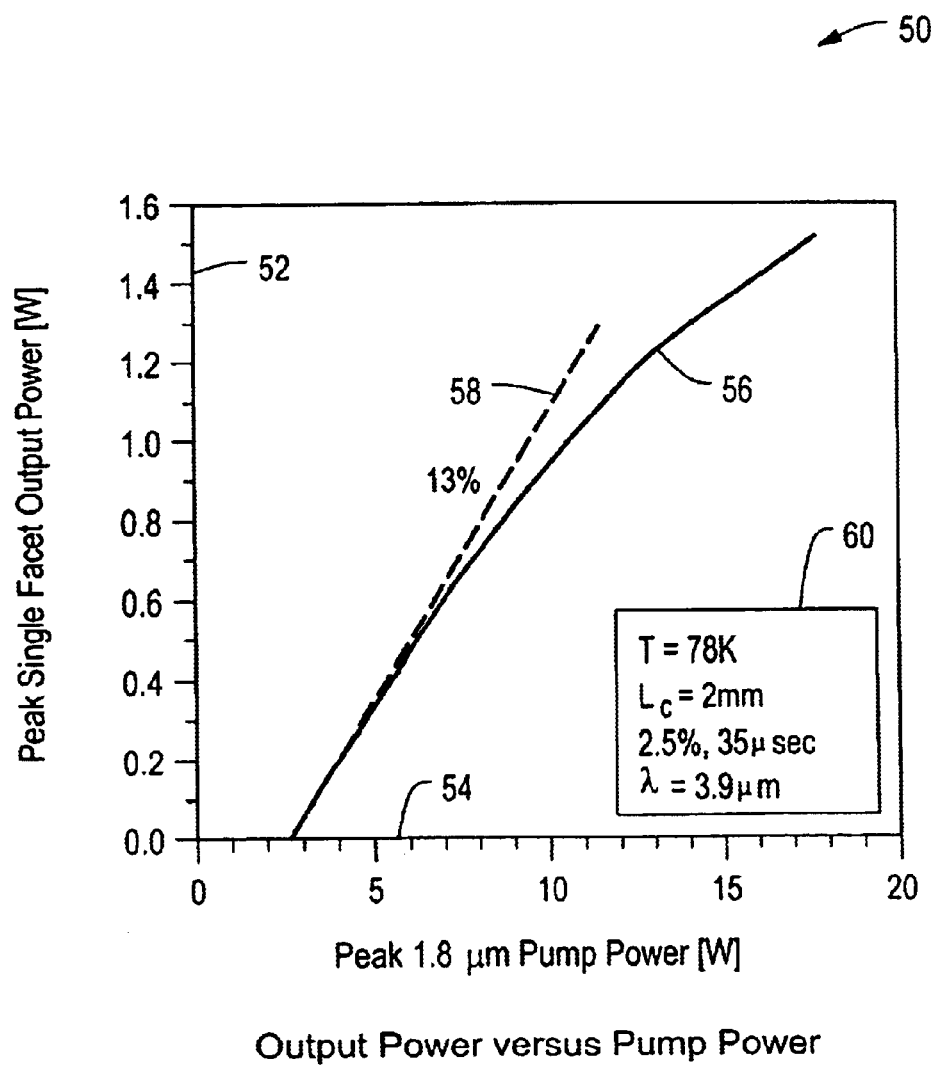
FIG. 3 is a graphs showing an output power versus optical pumping power for the semiconductor laser of FIG. 1.

Referring now to FIG. 3 in combination with FIG. 1, a graph 50 includes a first axis 52 corresponding to single facet output power in Watts, and a second axis 54 corresponding to optical pump power in Watts for the optical pump input. A curve 56 corresponds to the performance of the tested laser structure having particular characteristics described in association with FIG. 1, and corresponding to the exemplary semiconductor laser 10, (FIG. 1). The slope of the tangent 58 to the curve 56 shows the efficiency of the tested laser structure. Here, an efficiency of thirteen percent is indicated. As is known, a semiconductor diode laser has two reflectors, or facets, which define the length of the laser. Watts per facet means that an equal power is also emitted from the opposing facet from which the measurement was made.

It will be recognized that the efficiency of thirteen percent is relatively high for a conventional semiconductor laser operating at the mid-infrared region A variety of values listed in box 60, include a temperature value, T, at which the curve 56 was generated, a length value Lc, of the tested laser structure in the plane of the epitaxial layers, a duty cycle value, 2.5%, corresponding to the duty cycle of the optical pump, a time period value, 35 usec, corresponding to the power measurement time within the 100 micro-second pulse of the optical pump, and a wavelength value, λ, corresponding to the wavelength of the emitted laser light.

Figure 4:
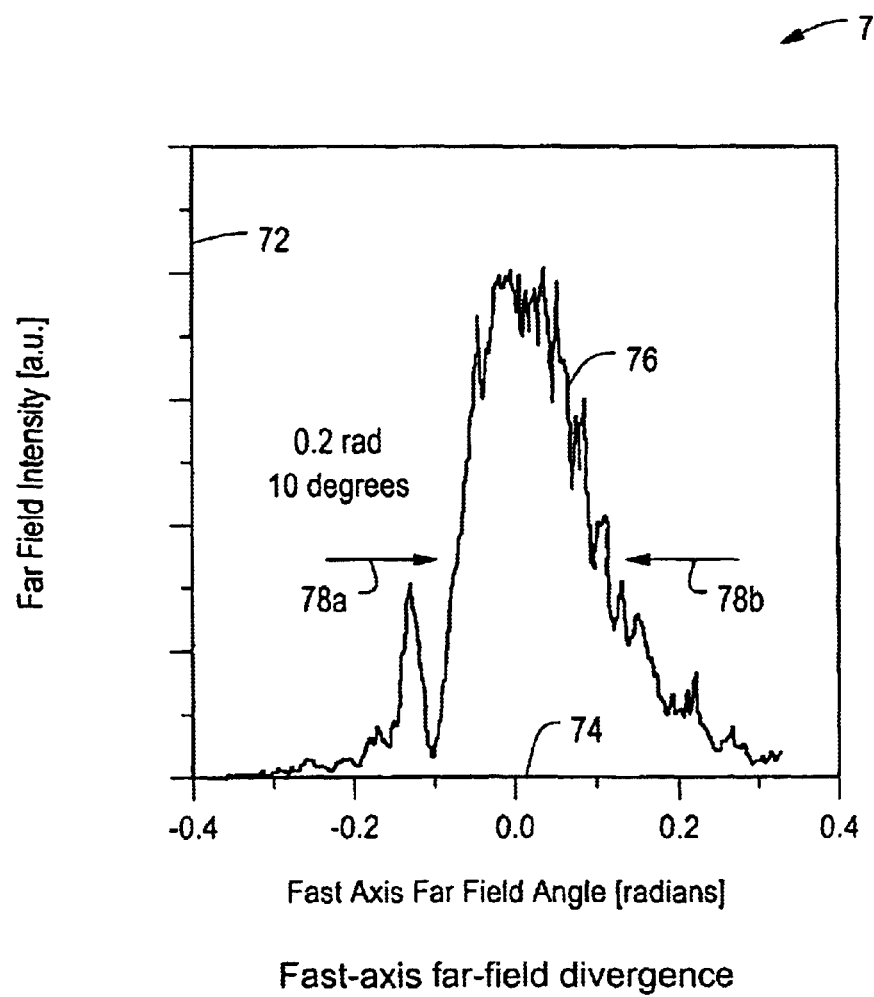
FIG. 4 is a graph showing laser light output intensity versus angle for the semiconductor laser of FIG. 1.

Referring now to FIG. 4 in combination with FIG. 1, a graph 70 includes a first axis 72 corresponding to far field intensity of emitted laser light in relative arbitrary units (a.u.), where intensity is understood to be power per area, and a second axis 74 corresponding to far field angle in radians. A curve 76 corresponds to the performance of the tested laser structure having particular characteristics described in association with FIG. 1, and corresponding to the exemplary semiconductor laser 10, (FIG. 1). The curve 76 indicates the intensity of laser light versus angle for the tested laser structure. More particularly, the curve 76 indicates the intensity of the laser light in the far field about the fast-axis. The fast-axis will be recognized to be the axis perpendicular to the plane of the epitaxial layers, i.e. perpendicular to the plane corresponding to the cladding layers. An angle of zero degrees on the second axis 74 corresponds to a direction normal to the laser facet. A total angle at the half power points, indicated by arrows 78a, 78b, shows the divergence angle to be approximately 10 degrees.

It will be recognized that the divergence angle of 10 degrees is less than a divergence angle provided by a conventional semiconductor laser operating at the mid-infrared region.

All references cited herein are hereby incorporated herein by reference in their entirety.

Having described preferred embodiments of the invention, it will now become apparent to one of ordinary skill in the art that other embodiments incorporating their concepts may be used. It is felt therefore that these embodiments should not be limited to disclosed embodiments, but rather should be limited only by the spirit and scope of the appended claims.

What is claimed is:

1. A semiconductor laser having a laser output port, the semiconductor laser comprising:
   an active core comprising Ga; and
   an optical cladding layer disposed on each side of said active core with at least one of said cladding layers consisting of GaSb and disposed about said active core such that the semiconductor laser emits laser energy from the laser output port.

2. The semiconductor laser of claim 1 wherein said laser emits laser energy in the 1.5 to 12 micron wavelength region.

3. The semiconductor laser of claim 1 wherein said active core further comprises In, Sb and As.

4. The semiconductor laser of claim 1 wherein said active core comprises a quantum well structure provided by alternating layers of InAs and InGaSb.

5. The semiconductor laser of claim 1 wherein a first one of said optical cladding layers is of n-type conductivity and a second one of the other optical cladding layer is of p-type conductivity.

6. The semiconductor laser of claim 1 wherein each of the optical cladding layers consists essentially of GaSb.

7. The semiconductor laser of claim 1 wherein at least one of the optical cladding layers has a thickness of about 4 micrometers.

8. The semiconductor laser of claim 1 wherein said active core comprises a first layer of GaInAsSb disposed between a first layer of InAs and a first one of optical cladding layers.

9. The semiconductor laser of claim 8 wherein said active core further comprises a second layer of GaInAsSb disposed between a second layer of InAs and a second one of the optical cladding layers.

10. The semiconductor laser of claim 9 wherein the active core has a thickness of about 1 micrometer.

11. The semiconductor laser of claim 9 wherein the first and the second layers of GaInAsSb have a thickness of 5 to 1000 nanometers.

12. The semiconductor laser of claim 9 wherein said active core further comprises a third layer of GaInAsSb disposed between first and second quantum well structures.

13. The semiconductor laser of claim 12 wherein the third layer of GaInAsSb has a thickness of 5 to 1000 nanometers.

14. The semiconductor laser of claim 1, wherein said active core comprises layers of GaInAsSb disposed on both sides of quantum well structures, the quantum well structures provided by alternating layers of InAs and InGaSb.

15. A semiconductor laser emitting radiation in the 3 to 12 micron region at an output port thereof, the semiconductor laser comprising:

an active core comprising Ga; and an optical cladding layer disposed on each side of said active core with at least one of said optical cladding layers consisting essentially of $Al_xGa_{1-x}As_ySb_{1-y}$, wherein the Al fraction, x, is less than 25 percent.

16. The semiconductor laser of claim 15 wherein the Al fraction, x, is less than 10 percent.

17. The semiconductor laser of claim 15 wherein the Al fraction, x, is zero percent.

18. The semiconductor laser of claim 15 wherein said active core comprises In, Ga, Sb and As.

19. The semiconductor laser of claim 15 wherein said active core comprises a quantum well structure provided by alternating layers of InAs and InGaSb.

20. The semiconductor laser of claim 15 wherein a first one of said optical cladding layers is of n-type conductivity and a second one of the other optical cladding layer is of p-type conductivity.

21. The semiconductor laser of claim 15 wherein at least one of the optical cladding layers consists of $Al_xGa_{1-x}As_ySb_{1-y}$.

22. The semiconductor laser of claim 15 wherein each of the optical cladding layers consists essentially of $Al_xGa_{1-x}As_ySb_{1-y}$.

23. The semiconductor laser of claim 15 wherein at least one of the optical cladding layers has a thickness of about 4 micrometers.

24. The semiconductor laser of claim 15 wherein said active core further comprises a first layer of GaInAsSb disposed between a first layer of InAs and a first one of the optical cladding layers.

25. The semiconductor laser of claim 24, wherein said active core further comprises a second layer of GaInAsSb disposed between a second layer of InAs and a second one of the optical cladding layers.

26. The semiconductor laser of claim 25, wherein the active core of has a thickness of about 1 micrometer.

27. The semiconductor laser of claim 25, wherein the first arid the second layers of GaInAsSb have a thickness of 5 to 1000 nanometers.

28. The semiconductor laser of claim 25 wherein said active core further comprises a third layer of GaInAsSb disposed between first and second quantum well structures.

29. The semiconductor laser of claim 28 wherein the third layer of GaInAsSb has a thickness of 5 to 1000 nanometers.

30. The semiconductor laser of claim 15, wherein said active core further comprises layers of GaInAsSb disposed between quantum well structures, the quatuni well structures provided by alternating layers of InAs and InGaSb.

31. An electrically pumped semiconductor laser having a laser output port, the semiconductor laser comprising:

an active core comprising a quantum well structure; and an optical cladding layer on each side of the active core, with one optical cladding layer being of n-type conductivity and the other optical cladding layer being of p-type conductivity and with at least one of tbe n-type or p-type optical cladding layers consisting of GaSb, wherein the semiconductor laser is adapted to emit laser energy at the laser output port.

32. The semiconductor laser of claim 31 wherein said active core quantum well structure is provided by alternating layers of InAs and InGaSb.

33. The semiconductor laser of claim 32 further comprising means, coupled to at least one of said cladding layers, for electrically pumping the semiconductor laser.

34. A semiconductor laser comprising:

an active core comprising a quantum well structure provided by alternating layers of InAs and InGaSb; and an optical cladding layer on each side of the active core, wherein said optical cladding layer comprises GaSb and is substantially free of Al.

35. The semiconductor laser of claim 34 wherein a first one of said optical cladding layers is of n-type conductivity and a second one of the other optical cladding layer is of p-type conductivity.

* * * * *

UNITED STATES PATENT AND TRADEMARK OFFICE
CERTIFICATE OF CORRECTION

PATENT NO. : 6,813,296 B2
DATED : November 2, 2004
INVENTOR(S) : Goyal et al.

It is certified that error appears in the above-identified patent and that said Letters Patent is hereby corrected as shown below:

Column 1,
Line 53, delete "arrangement the" and replace with -- arrangement, the --.

Column 3,
Line 24, delete "is a graphs" and replace with -- is a graph --.

Column 5,
Line 45, delete "region" and replace with -- region. --.

Column 7,
Line 40, delete "core of has" and replace with -- core has --.

Signed and Sealed this

Eighth Day of November, 2005

JON W. DUDAS
*Director of the United States Patent and Trademark Office*